(12) United States Patent
Nagai et al.

(10) Patent No.: US 7,944,059 B2
(45) Date of Patent: May 17, 2011

(54) SEMICONDUCTOR DEVICE HAVING A PROBING REGION

(75) Inventors: Noriyuki Nagai, Nara (JP); Toshihiko Sakashita, Osaka (JP)

(73) Assignee: Panasonic Corporation, Osaka (JP)

( * ) Notice: Subject to any disclaimer, the term of this patent is extended or adjusted under 35 U.S.C. 154(b) by 358 days.

(21) Appl. No.: 11/494,705

(22) Filed: Jul. 28, 2006

(65) Prior Publication Data

US 2007/0052085 A1    Mar. 8, 2007

(30) Foreign Application Priority Data

Aug. 9, 2005  (JP) ................................. 2005-230193

(51) Int. Cl.
- *H01L 23/48* (2006.01)
- *H01L 23/52* (2006.01)
- *H01L 29/40* (2006.01)

(52) U.S. Cl. ........ 257/781; 257/758; 257/778; 257/786; 257/E23.02

(58) Field of Classification Search ............... 257/758, 257/778, 784, 786, 781, E23.02
See application file for complete search history.

(56) References Cited

U.S. PATENT DOCUMENTS

| | | | | |
|---|---|---|---|---|
| 5,751,065 | A * | 5/1998 | Chittipeddi et al. | 257/758 |
| 5,986,343 | A * | 11/1999 | Chittipeddi et al. | 257/758 |
| 6,166,442 | A | 12/2000 | Nakamura | 257/773 |
| 6,198,170 | B1 * | 3/2001 | Zhao | 257/784 |
| 6,448,641 | B2 * | 9/2002 | Ker et al. | 257/700 |
| 6,653,729 | B2 | 11/2003 | Ishii | 257/700 |
| 6,746,951 | B2 * | 6/2004 | Liu et al. | 438/627 |
| 6,747,355 | B2 * | 6/2004 | Abiru et al. | 257/758 |
| 6,803,302 | B2 * | 10/2004 | Pozder et al. | 438/612 |
| 6,815,325 | B2 * | 11/2004 | Ishii | 438/612 |
| 6,844,631 | B2 | 1/2005 | Yong et al. | |
| 2006/0097396 | A1 | 5/2006 | Kamiyama et al. | 257/758 |

FOREIGN PATENT DOCUMENTS

| | | |
|---|---|---|
| JP | 2000-49223 | 2/2000 |
| JP | 2000-200905 | 7/2000 |
| JP | 2002-110731 | 4/2002 |
| JP | 2004-063652 | 2/2004 |
| JP | 2006-108329 | 4/2006 |
| WO | WO 2004/040646 | 5/2004 |

* cited by examiner

*Primary Examiner* — Shouxiang Hu

(74) *Attorney, Agent, or Firm* — Steptoe & Johnson LLP

(57) ABSTRACT

In a semiconductor device, a pad metal has at least a portion located immediately under a probe region, and the portion is divided into a plurality of narrow metal layers each arranged in parallel with a traveling direction of a probe. Thus, it is possible to enhance surface flatness of the pad metal and to prevent a characteristic of a semiconductor device from deteriorating without complication in processing and increase in chip size.

10 Claims, 6 Drawing Sheets

F I G. 1
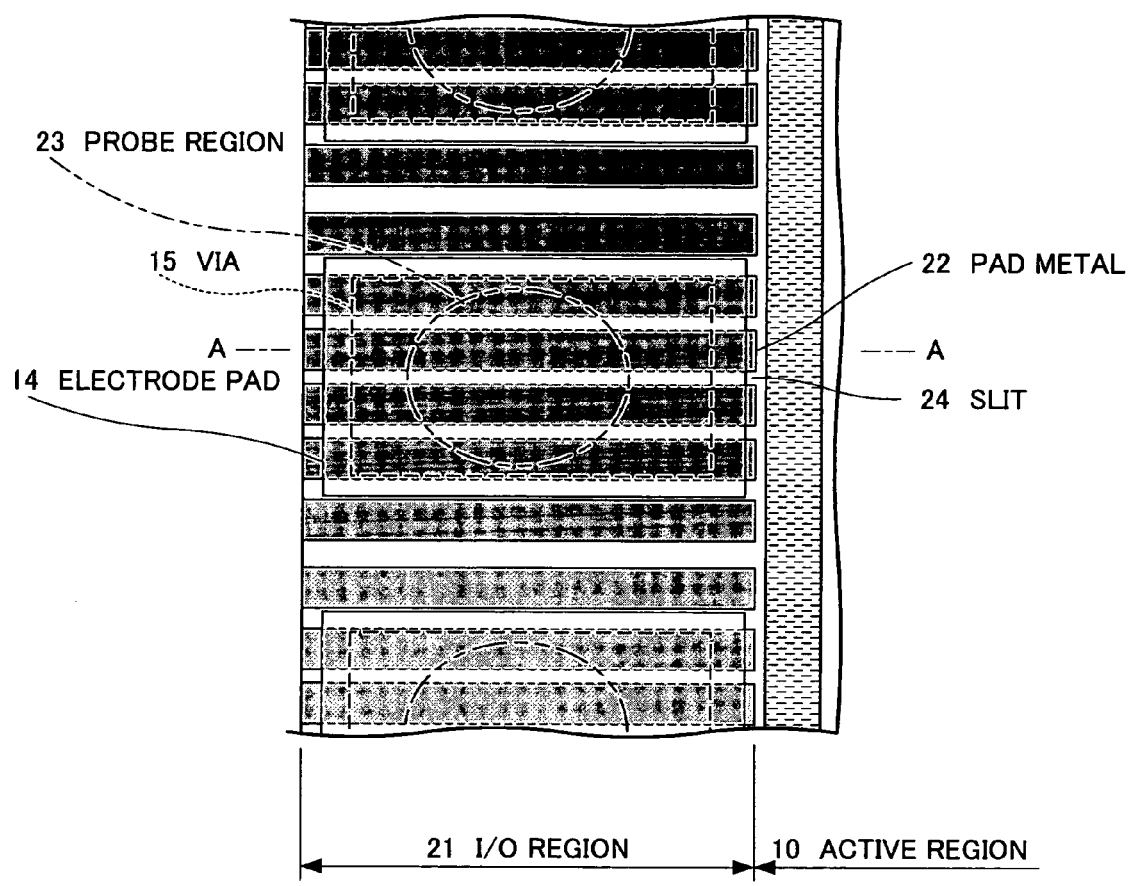
F I G. 2
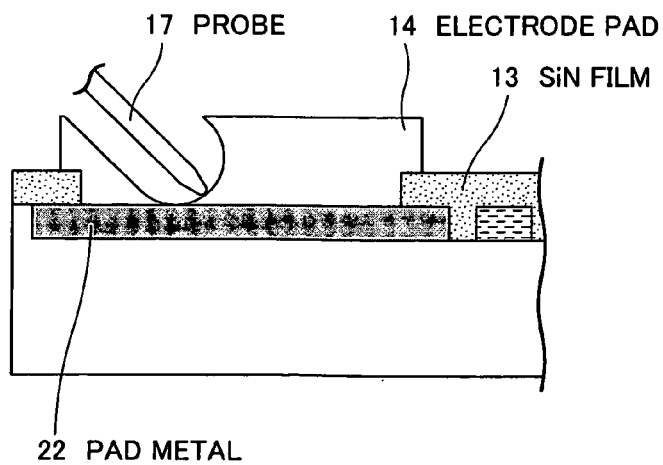

SEMICONDUCTOR DEVICE HAVING A PROBING REGION

BACKGROUND OF THE INVENTION

1. Field of the Invention

The present invention relates to a semiconductor device including an I/O cell functioning as an external terminal.

2. Description of the Related Art

In general, a semiconductor device includes an I/O cell serving as an input/output unit for connecting between an internal circuit and an external device or the like. The I/O cell has an electrode pad connected to a bonding wire or formed with a bump; thus, the semiconductor device is electrically connected to the external device or the like. In an inspection of the semiconductor device, a probe is brought into contact with the electrode pad, so that the semiconductor device is electrically connected to a tester.

Description will be given of a structure of an I/O cell in a conventional semiconductor device with reference to FIGS. 9A, 9B, 10 and 11.

FIG. 9A is a plan view illustrating a conventional semiconductor device. FIG. 9B is an enlarged view mainly illustrating a region of an I/O cell in the conventional semiconductor device. Specifically, FIG. 9B is an enlarged view of an I/O region illustrated in FIG. 9A. FIG. 10 is a sectional view illustrating a portion near the I/O region in the conventional semiconductor device, taken along a line A-A in FIGS. 9A and 9B. Also, FIG. 10 schematically illustrates a state of an electrode pad in probing. FIG. 11 is a sectional view illustrating an electrode pad formed with a bump in the conventional semiconductor device.

The semiconductor device includes an active region 10 having an internal circuit formed thereon and an I/O region having an I/O cell 11 formed thereon. The I/O cell 11 serves as an input/output unit connected to the internal circuit.

As illustrated in FIGS. 9A, 9B and 10, the conventional I/O cell 11 leads signals, power and the like from the internal circuit formed on the active region 10 to a pad metal 12 formed by a Cu wire at an uppermost layer of the I/O region formed by a plurality of layered Cu wires (this structure is not illustrated in the figures) and is connected, through a via 15, to an Al electrode pad 14 exposed from a SiN film 13 (not illustrated in FIGS. 9A and 9B) formed on a surface of the semiconductor device. Herein, the pad metal 12 has a shape almost equal to that of the electrode pad 14. In many cases, each of the pad metal 12 and the electrode pad 14 has a size in a range from 50 µm×80 µm to 70 µm×100 µm, and the Al electrode pad 14 has a thickness in a range from 450 µm to 2 µm.

When the semiconductor device is formed of a package such as a QFP or a BGA, as illustrated in FIG. 11, a bump 18, a solder ball or the like is formed on a region other than a probe region 16 of the electrode pad 14.

In an inspection, a probe 17 connected to a tester is brought into contact with the probe region 16 of the electrode pad 14. Upon contact of the probe 17, the electrode pad 14 is perforated along a traveling direction of the probe 17. Herein, the electrode pad 14 is perforated such that the pad metal 12 is exposed from the hole, so that the probe 17 may be directly connected to the electrode pad 14.

In terms of a problem of processing precision, however, surface flatness tends to deteriorate upon forming a pattern with a large area. In the structure of the conventional I/O cell, the electrode pad 14 has a minimum area required to perform probing; therefore, the pad metal 12 having a shape almost equal to that of the electrode pad 14 is enlarged in area. Thus, irregularities are formed on a surface of the pad metal 12 and surface flatness deteriorates. Consequently, stress concentration at the irregularities on the surface of the pad metal 12 causes cracking of the pad metal 12 upon contact of the probe 17. In some cases, such cracking occurs at an interlayer film. Consequently, the following problem arises: a characteristic of the semiconductor device deteriorates due to a short circuit between the lower Cu wire and the pad metal 12 and destruction of the lower Cu wire or the circuit.

In order to solve the aforementioned problem, JP2004-235416A proposes a structure that a dummy wire is provided immediately under a pad metal so as to lessen influence due to cracking. However, such a structure has the following problems. The formation of the extra layer causes complication of processing. In addition, if the dummy wire is formed using an existing wiring layer, an area of an I/O region is disadvantageously enlarged, resulting in increase in chip size.

SUMMARY OF THE INVENTION

The present invention is made to solve the aforementioned problems, and it is therefore an object of the present invention to provide a semiconductor device capable of enhancing surface flatness of a pad metal and preventing a characteristic of the semiconductor device from deteriorating without causing complication in processing and increase in chip size.

In order to achieve this object, a semiconductor device of the present invention includes an electrode pad region having an electrode pad formed thereon and serving as an external terminal, and an active region having an internal circuit formed thereon. The semiconductor device comprises a pad metal connected with a wire from the internal circuit and located in a layer under the electrode pad, and a via for electrically connecting between the electrode pad and the pad metal. Herein, a slit is formed in at least a portion of the pad metal.

According to another aspect of the invention, a semiconductor device includes an electrode pad region having an electrode pad formed thereon and serving as an external terminal, and an active region having an internal circuit formed thereon. The semiconductor device comprises a pad metal connected with a wire from the internal circuit and located in a layer under the electrode pad through an interlayer film, and a via for penetrating through the interlayer film and electrically connecting between the electrode pad and the pad metal. Herein, a slit is formed in at least one portion of the pad metal.

Further, the via is formed on a region other than a probe region.

Further, the electrode pad is formed to extend to the active region.

Further, the semiconductor device further comprises a shield wire formed under the electrode pad in the active region.

Further, the interlayer film is a SiN layer.

Further, the at least one portion of the metal pad formed with the slit includes a portion immediately under a probe region where an inspection probe moves in the electrode pad during inspection, and the slit extends in a traveling direction of the inspection probe.

Further, the slit is formed only in the portion immediately under the probe region of the pad metal.

Still further, at least one end of the slit is an open end.

Further, the number of the slits is plural.

Further, each metal layer of the pad metal sandwiched between the plurality of slits has a width of not large than 20 µm.

Still further, the pad metal is formed by a metal layer made of Cu, and the electrode pad is made of Al.

BRIEF DESCRIPTION OF THE DRAWINGS

FIG. 2 is a sectional view of the region of the I/O cell according to the first embodiment of the present invention;

FIG. 10 is a sectional view of a portion near an I/O region according to the conventional semiconductor device; and FIG. 11 is a sectional view of an electrode pad formed with a bump according to the conventional semiconductor device.

DESCRIPTION OF THE PREFERRED EMBODIMENTS

An I/O cell in a semiconductor device according to the present invention has the following configuration: an internal circuit formed on an active region is led to a pad metal formed by a wire at an uppermost layer of an I/O region formed by a plurality of layered wires and is connected, through a via, to an electrode pad exposed from an interlayer film formed on a surface of the semiconductor device. In the I/O cell in the semiconductor device according to the present invention, the pad metal has at least a portion located immediately under a probe region, and the portion is divided into a plurality of narrow metal layers each arranged in parallel with a traveling direction of a probe. If an interlayer film is interposed between the pad metal and the electrode pad, a via for connecting between the pad metal and the electrode pad is formed on an end of the I/O cell and a probe region into which a probe comes into contact is provided on a side close to the active region relative to the via.

As described above, the plurality of narrow pad metals are aggregately formed immediately under the probe region into which the probe comes into contact, in the traveling direction of the probe. Therefore, an area per pad metal becomes smaller than that of a conventional pad metal having a shape almost equal to that of an electrode pad. In processing, thus, it is possible to enhance surface flatness, to alleviate stress concentration upon contact of the probe, to lessen influence on a region under the I/O cell, and to prevent a characteristic of the semiconductor device from deteriorating. In addition, a stress due to the contact of the probe with the probe region is only applied to each of the divided pad metals, so that the stress does not exert influence on a whole region under the electrode pad. Thus, it is possible to lessen the influence on the region under the I/O cell and to prevent the characteristic of the semiconductor device from deteriorating.

Hereinafter, description will be given of preferred embodiments of the present invention with reference to the drawings while a semiconductor device including a Cu wire and an Al electrode pad is adopted as an example.

First Embodiment

First, description will be given of a semiconductor device according to a first embodiment with reference to FIGS. 1, 2, 3 and 4.

Figure 3:
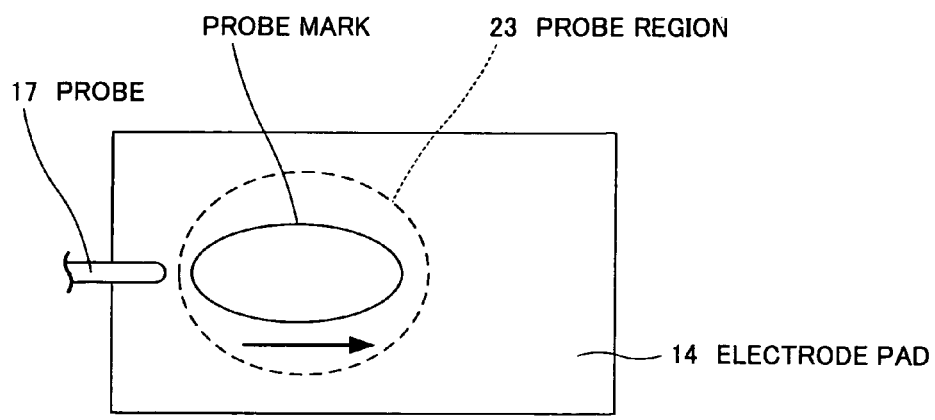
FIG. 3 illustrates a probe region in an electrode pad of the I/O cell.
Figure 4:
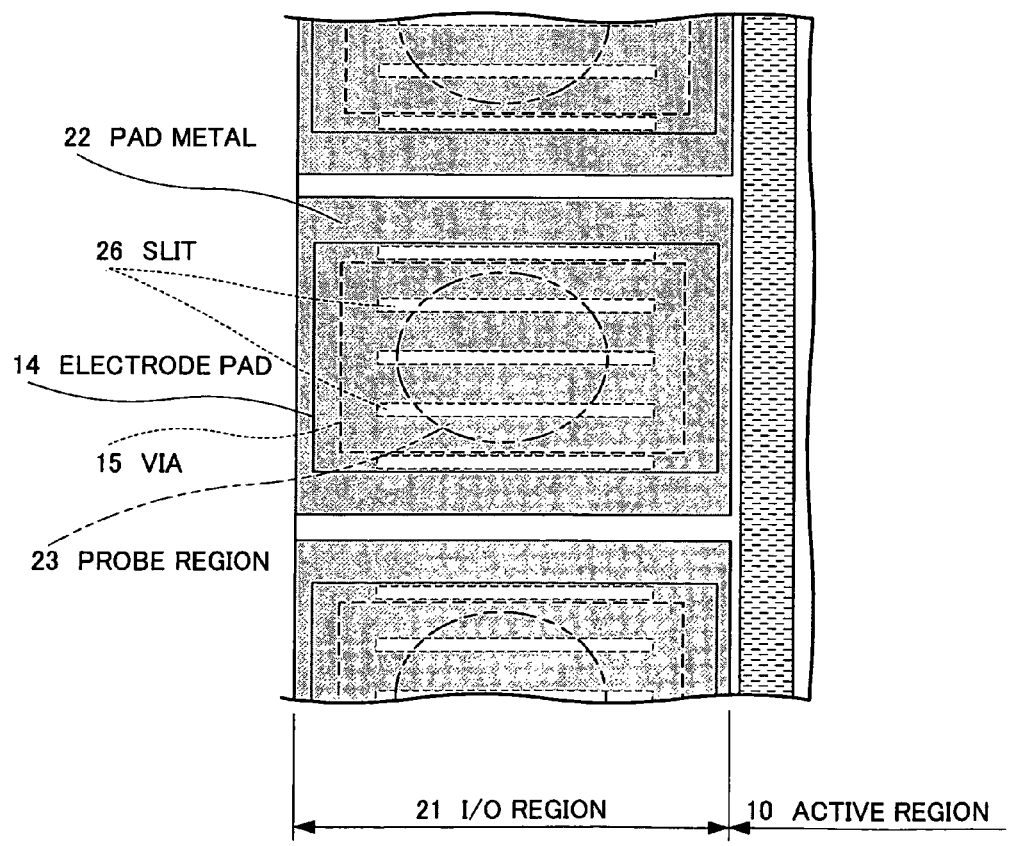
FIG. 4 is a plan view of the region of the I/O cell where slits are formed only in the probe region according to the first embodiment of the present invention.
Figure 1:
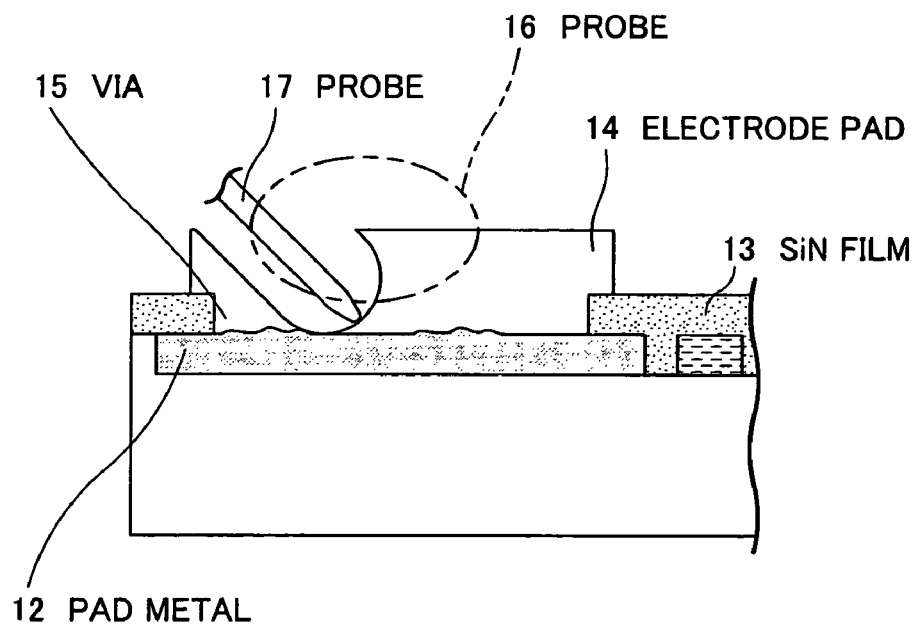
FIG. 1 is a plan view of a region of an I/O cell in a first embodiment of the present invention.
Figure 1:
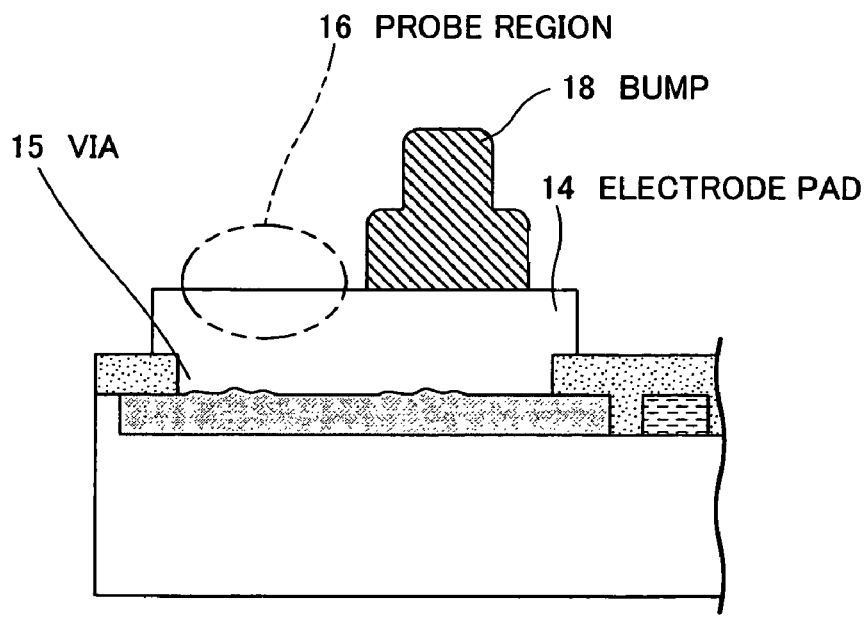

FIG. 1 is a plan view illustrating a region of an I/O cell in the first embodiment of the present invention. FIG. 2 is a sectional view illustrating the region of the I/O cell in the first embodiment of the present invention, taken along a line A-A in FIG. 1. FIG. 3 illustrates a probe region in an electrode pad of the I/O cell. FIG. 4 is a plan view illustrating the region of the I/O cell where slits are provided only at the probe region in the first embodiment of the present invention.

As illustrated in FIGS. 1 and 2, the I/O cell in this embodiment, similar to that of a conventional semiconductor device, leads signals, power and the like from an internal circuit formed on an active region 10 to a pad metal 22 formed by a Cu wire at an upper most layer of an I/O region 21 formed by a plurality of layered Cu wires (this structure is not illustrated in the figures) and is connected, through a via 15, to an Al electrode pad 14 exposed from a SiN film 13 (not illustrated in FIG. 1) formed on a surface of the semiconductor device. The electrode pad 14 has a shape similar to that of an electrode pad in the conventional I/O cell. In the conventional I/O cell, a metal layer serving as a pad metal is formed over a region where an electrode pad is to be formed. However, the pad metal 22 in this embodiment is provided with slits 24. Thus, the pad metal 22 is divided into a plurality of narrow Cu layers each arranged in parallel with a traveling direction of a probe, as illustrated in FIG. 1.

As described above, the pad metal 22 is divided into a plurality of rectangular Cu layers, so that an area per Cu layer can be made small and surface flatness of the Cu layer can be enhanced. Thus, it is possible to alleviate stress concentration upon contact of a probe, to lessen influence on a region under the I/O cell, and to prevent a characteristic of the semiconductor device from deteriorating. In addition, a stress due to the contact of a probe with a probe region 23 is only applied to each of the divided pad metals 22, so that the stress does not exert influence on a whole region under the electrode pad 14. Thus, it is possible to lessen the influence on the region under the I/O cell and to prevent the characteristic of the semiconductor device from deteriorating.

Herein, description will be given of the probe region 23 on the pad metal 22 with reference to FIG. 3.

As illustrated in FIG. 3, a probe 17 is set so as to come into contact with the probe region 23 of the electrode pad 14. The probe 17 travels from an outside of the semiconductor device toward the active region 10, perforates the electrode pad 14, and comes into contact with electrode pad 14.

In the aforementioned description, the electrode pad 14 is divided by the slits 24 provided in the entire pad metal 22 in the traveling direction of the probe 17. However, as illustrated in FIG. 4, the pad metal may be divided in such a manner that slits are provided only immediately under the probe region on the pad metal.

As illustrated in FIG. 4, in the metal pad 22, a region other than a region located immediately under the probe region 23 in the traveling direction of the probe 17 is planarized as conventional. However, the region located immediately under the probe region 23 is provided with the slits 24 such that the contact portion in the pad metal 22 is allowed to correspond to a narrow Cu layer extending in the traveling direction of the probe 17.

It is sufficient that such a narrow Cu layer is formed at least immediately under the probe region 23. In the description with reference to FIG. 4, the region other than the region located immediately under the probe region 23 in the traveling direction of the probe 17 is planarized; however, such a region may be opened at one end thereof by extension of the slits 24 and may be still planarized at the other end thereof.

Second Embodiment

Next, description will be given of a semiconductor device according to a second embodiment with reference to FIGS. 5 and 6.

Figure 5:
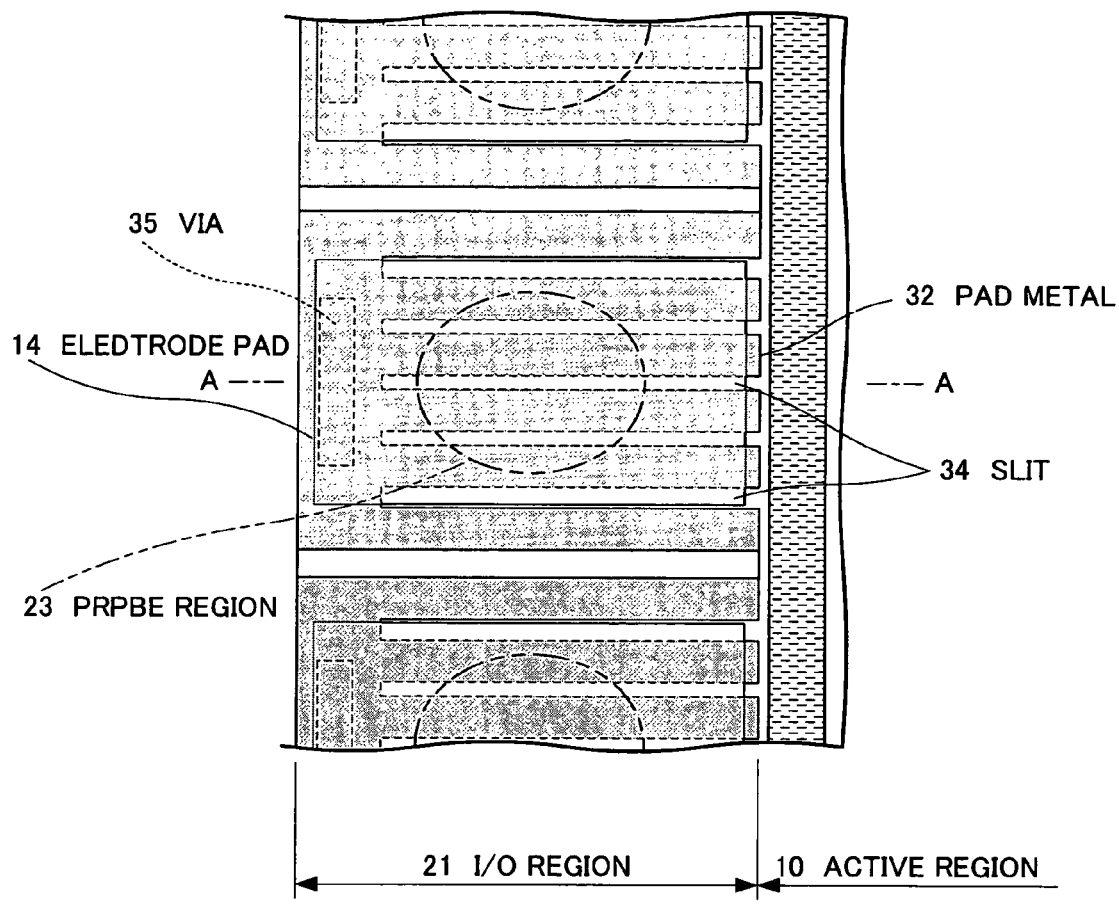
FIG. 5 is a plan view of a region of an I/O cell according to a second embodiment of the present invention.

FIG. 5 is a plan view illustrating a region of an I/O cell in the second embodiment of the present invention. FIG. 6 is sectional view illustrating the region of the I/O cell in the second embodiment of the present invention, taken along a line A-A in FIG. 5.

Figure 6:
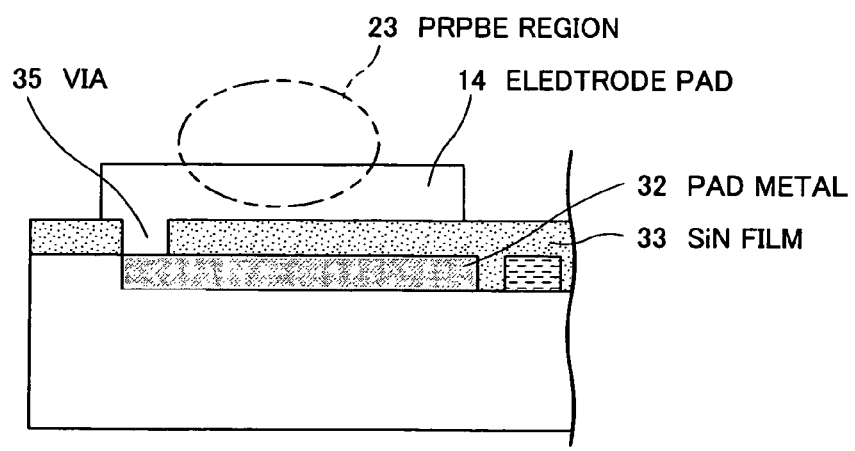
FIG. 6 is a sectional view of the region of the I/O cell according to the second embodiment of the present invention.

As illustrated in FIGS. 5 and 6, similar to the I/O cell in the conventional semiconductor device, an I/O cell in this embodiment leads signals, power and the like from an internal circuit formed on an active region 10 to a pad metal 32 formed by a Cu wire at an uppermost layer of an I/O region 21 formed by a plurality of layered Cu wires (this structure is not illustrated in the figures) and is connected to an Al electrode pad 14 through a via 35. In the I/O cell in the second embodiment, a SiN film 33 (not illustrated in FIG. 5) is formed on the pad metal 32 except a region corresponding to the via 35, and the electrode pad 14 is formed on the SiN film 33. The via 35 electrically connects between the electrode pad 14 and the pad metal 32. The via 35 is formed outside a probe region 23, desirably, is formed on an end of the I/O cell. The reason therefor is as follows: the via 35 must avoid exertion of influence of irregularities formed on a surface of the electrode pad 14 upon contact of a probe.

Herein, the pad metal 32 in this embodiment is provided with slits 34 and, therefore, is divided into a plurality of narrow Cu layers each extending in a traveling direction of a probe, as illustrated in FIG. 5. However, the end of the I/O cell has no slit 34 because of formation of the via 35.

As described above, the pad metal 32 including a portion located immediately under the probe region 23 is divided into a plurality of rectangular Cu layers. Therefore, an area per Cu layer can be made small. Thus, it is possible to enhance surface flatness of each Cu layer, to alleviate stress concentration upon contact of a probe, to lessen influence on a region under the I/O cell, and to prevent a characteristic of the semiconductor device from deteriorating. In addition, a stress due to the contact of the probe with the probe region 23 is only applied to each of the divided Cu layers of the pad metal 32, so that the stress does not exert influence on a whole region under the electrode pad 14. Thus, it is possible to lessen the influence on the region under the I/O cell and to prevent the characteristic of the semiconductor device from deteriorating.

As in the first embodiment, in the pad metal 32, a region other than a region located immediately under the probe region 23 in the traveling direction of the probe is planarized as conventional. The slits 34 are provided only immediately under the probe region 23. Thus, the contact portion in the pad metal 32 is allowed to correspond to a narrow Cu layer extending in the traveling direction of the probe.

Third Embodiment

Next, description will be given of a semiconductor device according to a third embodiment of the present invention with reference to FIGS. 7 and 8.

Figure 7:
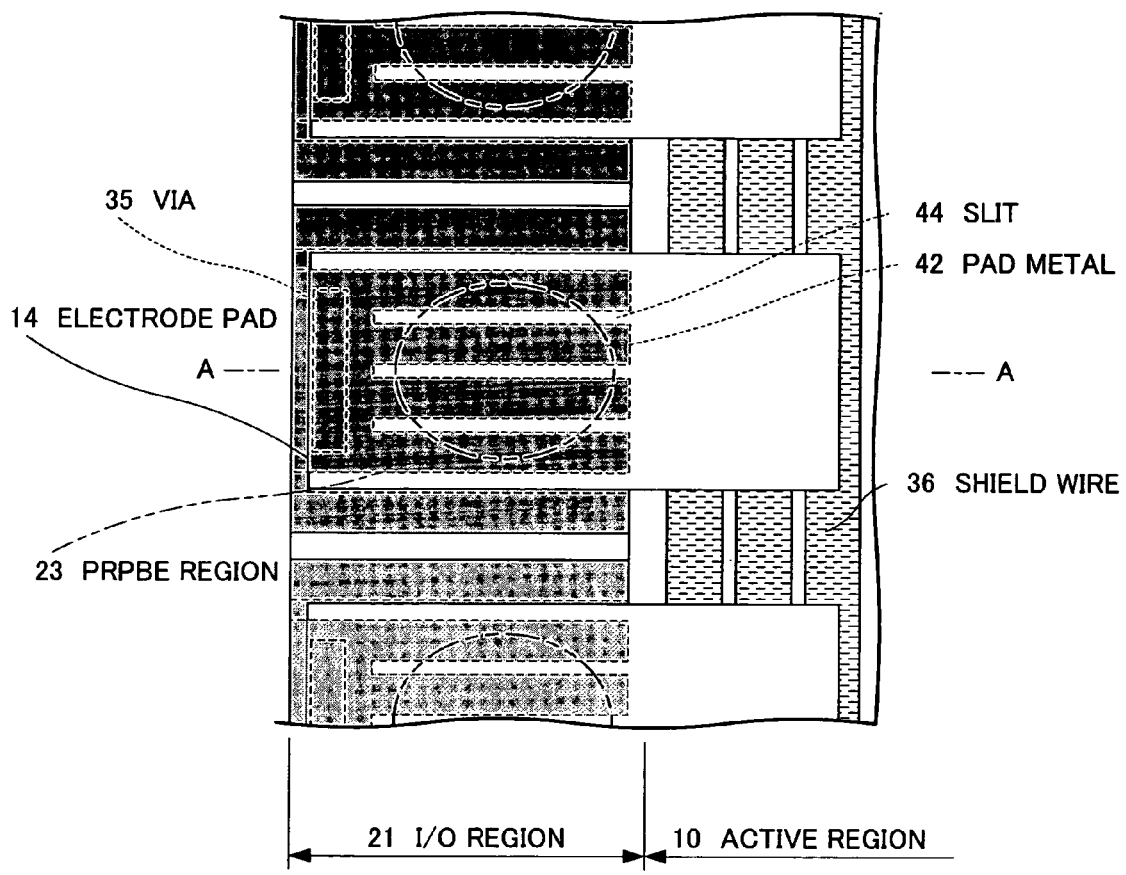
FIG. 7 is a plan view of a region of an I/O cell according to a third embodiment of the present invention.

FIG. 7 is a plan view illustrating a region of an I/O cell in the third embodiment of the present invention. FIG. 8 is a sectional view illustrating a configuration of the I/O cell formed with a bump in the third embodiment of the present invention.

In this embodiment, as in the second embodiment, a SiN film 33 (not illustrated in FIG. 7) is formed on a pad metal 42 provided with slits 44, except a region corresponding to a via 35. An electrode pad 14 is formed on the SiN film 33.

Herein, the electrode pad 14 is formed so as to reach an active region 10; therefore, an area of the I/O cell restricted by a minimum area of the electrode pad 14 can be decreased, and a chip size can be reduced. In addition, a shield wire 36 is generally routed through a portion of the active region 10 near the I/O cell. The shield wire 36 can be routed under the electrode pad 14.

Upon contact of a probe, the probe penetrates through the electrode pad 14 in some cases. However, a SiN film having a thickness of about 200 to 650 nm is formed immediately under the probe region 23 of the electrode pad 14, so that the probe never comes into contact with a wire such as the shield wire 36.

As described above, the pad metal 42 including a portion located immediately under the probe region 23 is divided into a plurality of rectangular Cu layers. Therefore, an area per Cu layer can be made small. Thus, it is possible to enhance surface flatness of each Cu layer, to alleviate stress concentration upon contact of a probe, lessen influence on a region under the I/O cell, and to prevent a characteristic of the semiconductor device from deteriorating. In addition, a stress due to the contact of the probe with a probe region 23 is only applied to each of the divided Cu layers of the pad metal 42, so that the stress does not exert influence on a whole region under the electrode pad 14. Thus, it is possible to lessen the influence on the region under the I/O cell and to prevent the characteristic of the semiconductor device from deteriorating.

As in the second embodiment, in the pad metal 42, a region other than a region immediately under the probe region 23 is planarized as conventional. The slits 44 are provided only immediately under the probe region 23. Thus, a contact portion in the pad metal 42 is allowed to correspond to a narrow Cu layer extending in the traveling direction of the probe.

Figure 8:
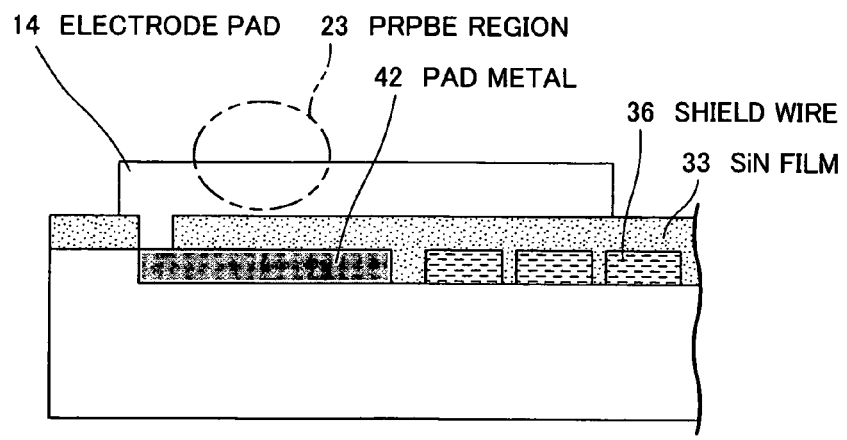
FIG. 8 is a sectional view illustrating a configuration of the I/O cell formed with a bump according to the third embodiment of the present invention.
Figure 9A:
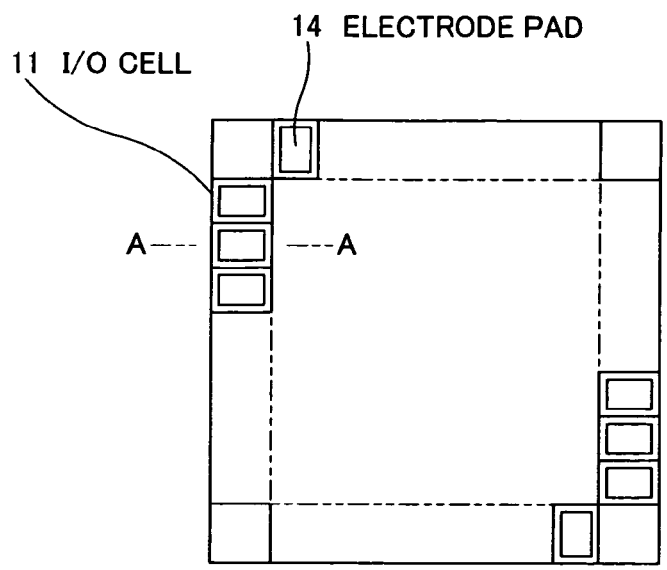
FIG. 9A is a plan view of a conventional semiconductor device.
Figure 9B:
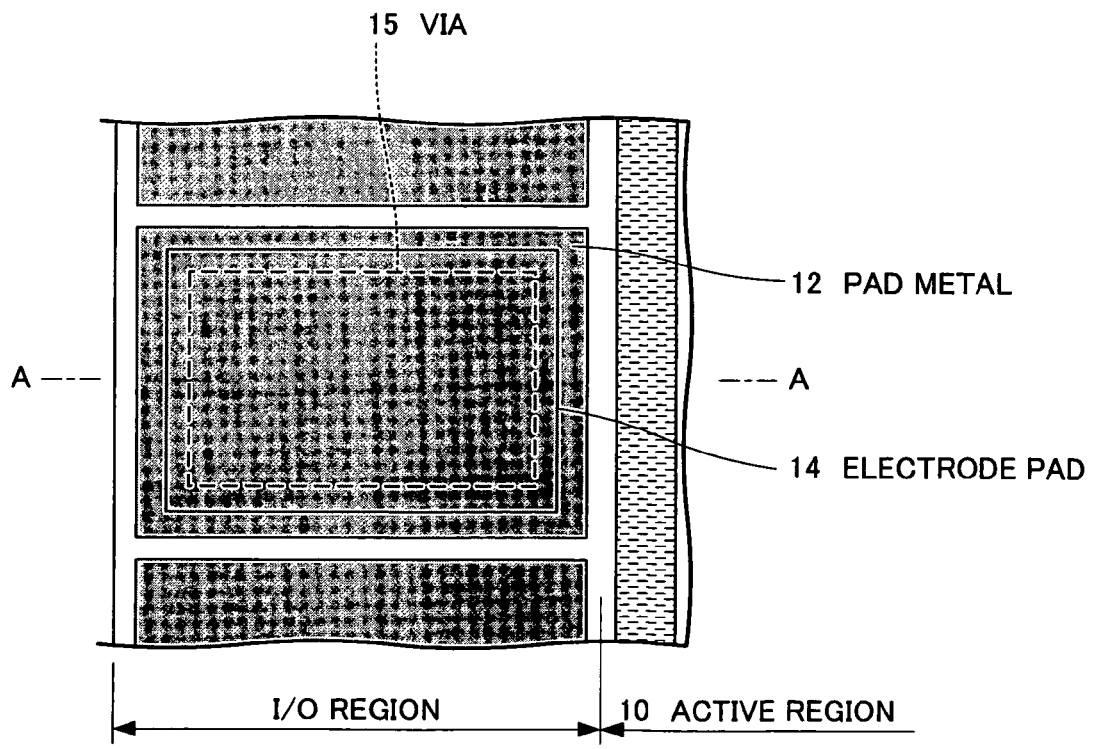
FIG. 9B is an enlarged view of a main part of an I/O cell according to the conventional semiconductor device.

If a stack bump 37 is formed on the I/O cell in this embodiment, such a stack bump 37 can be formed on the electrode pad 14 on the active region 10 as illustrated in FIG. 8.

In each of the aforementioned embodiments, an internal wire is made of Cu and an electrode pad is made of Al. However, even when any other metal materials are used in an optional combination, similar effects to those in the respective embodiments can be exhibited. Further, in each of the aforementioned embodiments, a SiN layer is used as an interlayer film. However, even when any other interlayer film material is used, similar effects to those in the respective embodiments can be exhibited.

As the width of each of the narrow metal layers divided by the slits is smaller, surface flatness is enhanced. Such a width is optimally about 0.2 μm at processing minimum. Herein, such a width is set at 20 μm or less, preferably about 9 μm in consideration of a design layout.

What is claimed is:

1. A semiconductor device comprising:
   an electrode pad region having an electrode pad formed thereon and serving as an external terminal for probing,
   an active region having an internal circuit formed therein,
   a pad metal connected with a wire from the internal circuit and located under the electrode pad,
   a via for electrically connecting the electrode pad and the pad metal,
   a plurality of slits in the pad metal,
   wherein the slits extend in only one direction in the pad metal, and one end of each of the slits is closed by an end portion of the pad metal, the via is located above the end portion of the pad metal, and the other ends of the slits are open.

2. The semiconductor device according to claim 1,
   wherein an interlayer film is located on the pad metal,
   the electrode pad is located on the interlayer film, and
   the via penetrates through the interlayer film.

3. The semiconductor device according to claim 2, wherein the interlayer film is a SiN layer.

4. The semiconductor device according to claim 2, wherein each metal layer of the pad metal sandwiched between the plurality of slits has a width of not larger than 20 μm.

5. The semiconductor device according to claim 2, wherein the pad metal is formed by a metal layer made of Cu, and the electrode pad is made of Al.

6. The semiconductor device according to claim 2, further comprising a probe region formed on the electrode pad.

7. The semiconductor device according to claim 6, wherein the via is formed in a region other than the probe region.

8. The semiconductor device according to claim 1, wherein the slits extend in the direction from the electrode pad region to the active region.

9. The semiconductor device according to claim 1, wherein the electrode pad has a rectangular shape, and the slits extend parallel to a long side of the electrode pad.

10. The semiconductor device according to claim 1, wherein the pad metal has a plurality of slender portions which are separated by the slits, and the slender portions extend in only one direction.

* * * * *